United States Patent
Xu

(10) Patent No.: US 8,902,962 B2
(45) Date of Patent: Dec. 2, 2014

(54) METHOD AND DEVICE FOR COMPENSATING FREQUENCY RESPONSE OF A FILTER UNIT IN REMOTE RADIO UNIT IN REAL TIME

(75) Inventor: Jack Xu, Beijing (CN)

(73) Assignee: Unwired Planet, LLC, Reno, NV (US)

( * ) Notice: Subject to any disclaimer, the term of this patent is extended or adjusted under 35 U.S.C. 154(b) by 40 days.

(21) Appl. No.: 13/512,910

(22) PCT Filed: Dec. 9, 2009

(86) PCT No.: PCT/CN2009/001408
§ 371 (c)(1),
(2), (4) Date: May 31, 2012

(87) PCT Pub. No.: WO2011/069275
PCT Pub. Date: Jun. 16, 2011

(65) Prior Publication Data
US 2012/0236923 A1    Sep. 20, 2012

(51) Int. Cl.
*H03H 7/30* (2006.01)
*H04B 17/00* (2006.01)
*H04B 1/04* (2006.01)

(52) U.S. Cl.
CPC .... *H04B 17/0007* (2013.01); *H04B 2001/0425* (2013.01)
USPC .......... 375/232; 375/229; 375/297; 455/307; 455/561

(58) Field of Classification Search
USPC .......... 375/229, 232, 296, 297, 356; 455/286, 455/307, 561
See application file for complete search history.

(56) References Cited

U.S. PATENT DOCUMENTS

| 7,545,859 B2 * | 6/2009 | Reichard ........................ 375/232 |
| 2006/0170581 A1 * | 8/2006 | Lin ................. 341/155 |
| 2010/0060358 A1 * | 3/2010 | Nentwig ........................ 330/199 |
| 2012/0128359 A1 * | 5/2012 | Mazzone et al. ................. 398/67 |

FOREIGN PATENT DOCUMENTS

| CN | 1337793 A | 2/2002 |
| CN | 101384024 A | 3/2009 |
| CN | 101420704 A | 4/2009 |
| CN | 101499781 A | 8/2009 |
| WO | 2005112254 A1 | 11/2005 |
| WO | 2007117189 A1 | 10/2007 |

OTHER PUBLICATIONS

International Search Report and Written Opinion mailed Sep. 23, 2010 in PCT Application No. PCT/CN2009/001408.

* cited by examiner

*Primary Examiner* — Leon-Viet Nguyen
(74) *Attorney, Agent, or Firm* — Nixon & Vanderhye, P.C.

(57) ABSTRACT

A method for compensating frequency response of a filter unit in remote radio unit in real time, said remote radio unit comprises filter unit equalizer, transmitter observation receiver and antenna calibration receiver, said method comprising the steps of: receiving input signal of said filter unit by transmitter observation receiver; receiving output signal of said filter unit by antenna calibration receiver; calculating coefficients of filter unit equalizer in real time based on said input signal and said output signal; updating said filter unit equalizer based on said calculated coefficients in order to compensate frequency response of said filter unit. A device to carry out the above method, remote radio unit comprising said device and a telecommunication system comprising said remote radio unit are also provided.

21 Claims, 6 Drawing Sheets

METHOD AND DEVICE FOR COMPENSATING FREQUENCY RESPONSE OF A FILTER UNIT IN REMOTE RADIO UNIT IN REAL TIME

TECHNICAL FIELD

The present application generally relates to remote radio unit, and more particularly, to a method and device for compensating frequency response of a filter unit in real time in such a remote radio unit.

ABBREVIATIONS

LTE long Term Evolution
RRU Remote Radio Unit
QAM Quadrature Amplitude Modulation
FU Filter Unit
EVM Error Vector Magnitude
RU Radio Unit
WCDMA Wideband Code Division Multiple Access
TOR Transmitter Observation Receiver
LMS Least Mean Square
IFFT Inverse Fast Fourier Transform
TD-SCDMA Time Division-Synchronous Code Division Multiple Access
AC Antenna Calibration
DPD Digital Pre-Distortion

BACKGROUND

For long Term Evolution (LTE), Remote Radio Unit (RRU) must support high order modulation signal, such as 64 Quadrature Amplitude Modulation (QAM). If filter unit (FU) frequency response (in both phase and amplitude) could not be compensated, EVM link budge become too tighten. EVM characterizes modulation precision, and is a key index of judging digital modulation quality in modern wireless communication system. EVM is vector difference between ideal measurement component I (In Phase) and Q (Quadrature Phase) (referred to as reference signal "R") of transmitted signal and I, Q component amplitude of the actually received measurement signal "M".

In prior art, to resolve the problem, Ericsson has imported FU equalizer to WCDMA RU and RRU product in order to improve EVM performance. However, FU must be placed in a factory, then characteristics of FU is to be tested and stored in a database. RRU application software read it from said database, then calculates the matched Finite Impulse Response (FIR) filter to inverse said characteristics of FU, whereby compensating the FU frequency response and improving the EVM performance. It takes a liter bit time for production and adds a small cost.

Problems with prior art are as follows:
1. Each FU needs external test equipment/time;
2. External storage (or data space) is needed to store the FU characteristics;
3. After being delivered to operator, the change of FU, temperature change, aging etc could no be tracked in real time;
4. During the production, the FU could not replace without calibration and external cost for RRU repair on production line are added.

Consequently, there is a need for a method and a device for compensating frequency response of FU in RRU in real time.

SUMMARY

Therefore, it is the object of the present invention to obviate or mitigate at least some of the above limitations by providing a method and a device for compensating frequency response of FU in RRU in real time.

In TDD RU design, the RRU has a dedicated antenna calibration (AC) port to support smart antenna that featured in TD-SCDMA. In this application, by employing Antenna Calibration (AC) and Transmitter Observation Receiver (TOR) path, real time FU Equalizer solution is given.

In one aspect of the invention, a method for compensating frequency response of FU in RRU in real time is provided. Said remote radio unit comprises filter unit equalizer, transmitter observation receiver and antenna calibration receiver, said method comprising the steps of:
a) receiving input signal of said filter unit by transmitter observation receiver;
b) receiving output signal of said filter unit by antenna calibration receiver;
c) calculating coefficients of filter unit equalizer in real time based on said input signal and said output signal;
d) updating said filter unit equalizer based on said calculated coefficients in order to compensate frequency response of said filter unit.

In a preferred embodiment, before step a), said method also comprises:
e) loading a default value coefficient of FU equalizer while initialing RRU.

In a preferred embodiment, said step of calculating coefficients of filter unit equalizer comprises the steps of:
comparing said input signal of FU with said output signal of FU;
extracting frequency response of FU;
obtaining frequency response of FU equalizer by inversing said frequency response of FU;
calculating coefficients of FU equalizer by an adaptive equalizer algorithm.

In an embodiment of the method, said adaptive equalizer algorithm can be implemented by adaptive filtering, such as Least Mean Square, Inverse Fast Fourier Transform and so on.

In an embodiment of the method, said default value coefficient of FU equalizer can be stored into memory when RRU is tested by test signal.

In an embodiment of the method, said default value coefficient of FU equalizer can be a coefficient of FU equalizer used at a time point when FU equalizer error occurs.

In an embodiment of the method, said filter unit is wide band passive filter.

In an embodiment of the method, said filter unit equalizer is implemented as digital filter with programmable coefficients.

In another aspect of the invention, a device for compensating frequency response of a Filter Unit (FU) in Remote Radio Unit (RRU) in real time, said device comprises:
Transmitter Observation Receiver (TOR) for receiving input signal of said FU;
Antenna Calibration Receiver (ACR) for receiving output signal of said FU;
calculating unit for calculating coefficients of FU equalizer in real time based on said input signal and said output signal;
updating unit for updating said FU equalizer based on said calculated coefficients in order to compensate frequency response of said filter unit.

In an embodiment, said device also comprises:

loading unit for loading a default value coefficient of FU equalizer while initialing RRU.

In an embodiment, said calculating unit comprises:

comparing means for comparing said input signal of FU with said output signal of FU;

extracting means for extracting frequency response of FU;

obtaining means for obtaining frequency response of FU equalizer by inversing said frequency response of FU;

calculating means for calculating coefficients of FU equalizer by an adaptive equalizer algorithm.

In an embodiment of the device, said adaptive equalizer algorithm can be implemented by adaptive filtering, such as Least Mean Square, Inverse Fast Fourier Transform and so on.

In an embodiment of the device, said default value coefficient of FU equalizer can be stored into memory when RRU is tested by test signal.

In an embodiment of the device, said default value coefficient of FU equalizer can be a coefficient of FU equalizer used at a time point when FU equalizer error occurs.

In an embodiment of the device, said filter unit is wide band passive filter.

In an embodiment of the device, said filter unit equalizer is implemented as digital filter with programmable coefficients.

In yet another aspect of the invention, a RRU comprising the device according to the invention is provided.

In yet another aspect of the invention, a telecommunication system comprising the RRU according to the invention is provided.

Advantages of the present invention comprise: the FU characteristic is calculated on application environment; since no hardware changes between normal operation and calibration phase, best performance can be obtained in real time; the equalization can be done on demand; it can track any change of FU on application environment; the FU replacement cost can be reduced and FU can be replaced without recalibration.

BRIEF DESCRIPTION OF THE DRAWINGS

The invention, together with further objects and advantages thereof, may be understood by making reference to the following description taken together with the accompanying drawings, in which.

Corresponding reference characters indicate corresponding components throughout the several views of the drawings.

DETAILED DESCRIPTION

The embodiments set forth below represent the necessary information to enable those skilled in the art to practice the invention and illustrate the best mode of the practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
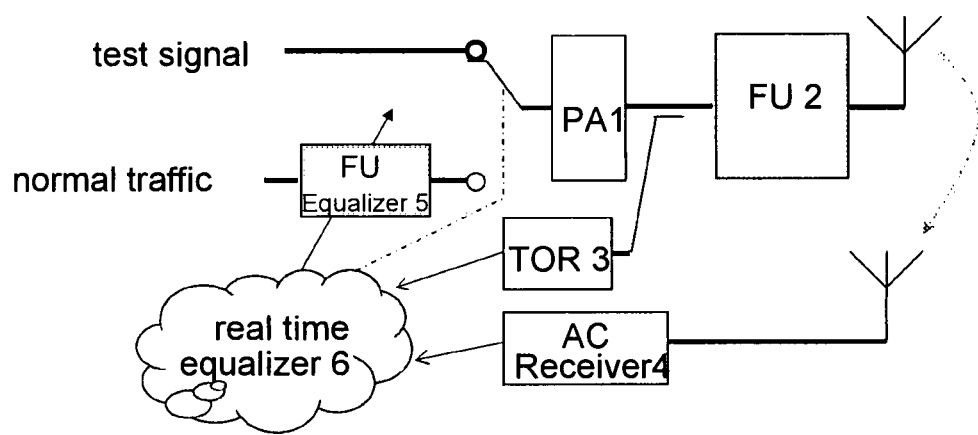
FIG. 1 is a schematic block diagram of RRU in which the present invention can be implemented.

A brief description of the different parts of the RRU in FIG. 1 is given below.

RRU comprises Power Amplifier (PA) 1, Filter Unit (FU) 2, Transmitter Observation Receiver (TOR) 3, Antenna Calibration (AC) receiver 4, FU equalizer 5 and real time equalizer 6. Of course, RRU also comprises other known components, which are unnecessary to understand the invention so that said components are not discussed therein. Further, PA 1 is a preferred component for amplifying the input signal. Therefore, without PA 1, the present invention can be achieved.

Preferably, FU 2 is wide band passive filter in a TDD RRU system, the transmitter and receiver share the same FU by different time slot, that is, in TDD system, the AC will share the hardware of receiver, and in transmitter time, the receiver is free for AC. The AC port can receive the transmitter signal from the AC (without FU). FU equalizer 5 can be implemented by a digital filter with programmable coefficients and different FUs, use a different set of coefficients.

During manufactory test, a test signal is sent to power amplifier 1 and then is received by TOR 3 and FU 2. The test signal is filtered by FU 2 and then is transmitted to AC receiver 4 by an air interface. Real time equalizer 6 compares the TOR signal with AC receiver signal. The FU characteristics can be extracted by real time equalizer 6. The FU equalizer characteristics are obtained by inversing the FU characteristics. It is easy to calculate the coefficients of FU equalizer by adaptive filtering, such as LMS (Least Mean Square), IFFT (Inverse Fast Fourier Transform) and so on. In doing so, a default value coefficient of filter unit equalizer can be obtained. Of course, the test signal is generated by a test signal generator in RRU. Then, said default value coefficient of filter unit equalizer can be stored in memory, such as flash memory.

In another option, the default value coefficient of FU equalizer can be a coefficient of FU equalizer used at a time point when an FU equalizer error occurs.

Preferably, when normal traffic is transmitted, in order to speed up the filter going to a stable condition, the FU equalizer 5 will load said default value coefficient from real time equalizer 6. These coefficients will be defined as the start value coefficients of filter unit equalizer. During RRU working, frequency response of FU 2 will be tracked in real time: The adaptive equalizer algorithm will modify the coefficients by checking the input signal of FU (that is TOR data) and output data of FU (that is AC data). Then the FU distortion can be compensated.

Figure 2:
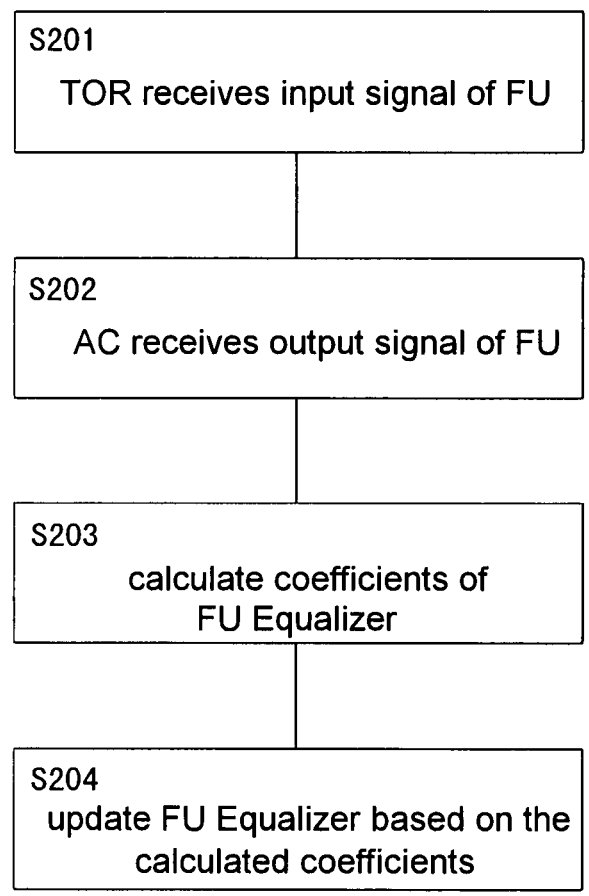
FIG. 2 is a schematic flow diagram of an embodiment of a method for compensating frequency response of a filter unit in remote radio unit in real time according to the present invention.

With reference to FIG. 2, an embodiment of a method for compensating frequency response of a FU 2 in remote radio unit in real time according to the present invention will be described.

At step s201, transmitter observation receiver receives input signal of said filter unit 2. After input signal is filtered by FU 2, antenna calibration receiver receives output signal of said filter unit at step s202. Then at step s203, coefficients of filter unit equalizer are calculated by real time equalizer based on said input signal and said output signal. Finally, at step s204, said filter unit equalizer 5 is updated based on said calculated coefficients in order to compensate frequency response of said filter unit 2.

Figure 3:
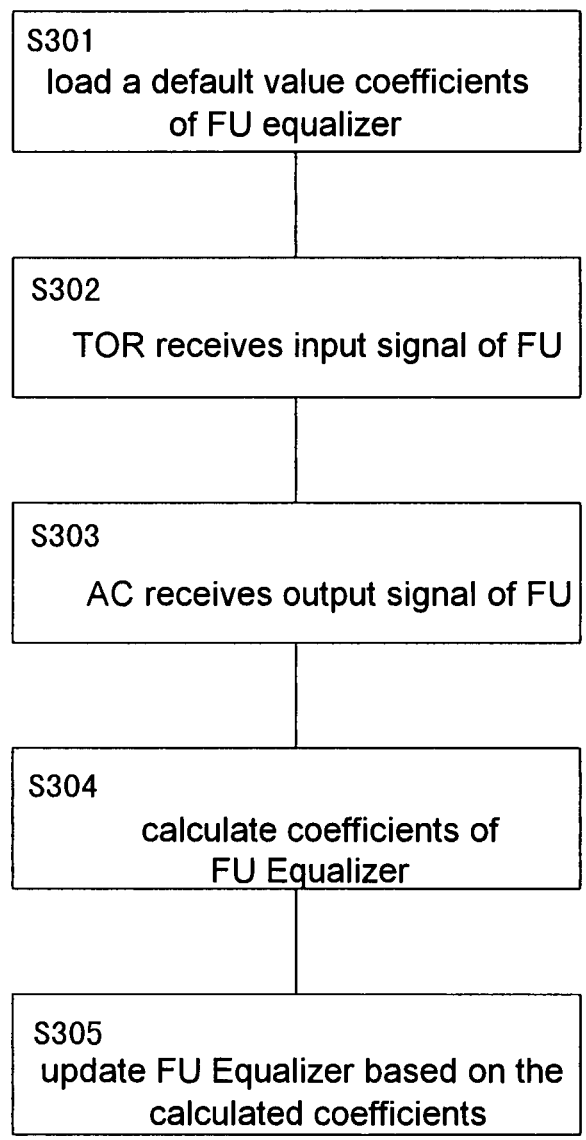
FIG. 3 is a schematic flow diagram of a preferred embodiment of the inventive method.

In a preferred embodiment of the invention, refer to FIG. 3, said method first performs the step of:

loading a default value coefficient of FU equalizer while initialing RRU, s301.

Then said method performs steps s302-s305, which are the same as steps s201-s204 in FIG. 2, so these steps are not described in detailed.

As stated above, when RRU goes to initialization status, in order to speed up the filter going to a stable condition and shorten convergence process, FU equalizer will load a default value coefficient of FU equalizer. How to obtain said default value coefficient has the following two options:

One option is done in the process of manufacturing, which is optional and not essential. During manufactory test, under application software and firmware control, a test signal is generated. The test signal can be a Multi Tone signal that occupies the whole bandwidth of normal operation. After amplified by PA 1, the test signal was received by TOR 3. Then the input signal of FU 2 is known by real time equalizer. The test signal is filtered by FU 2. The FU 2 makes some distortion on amplitude and phase. The calibration antenna will pick up this filtered signal and then this filtered signal is sent to AC receiver 4. The real time equalizer 6 compares the TOR signal with AC receiver signal. The FU characteristics can be extracted by the real time equalizer 6 and the frequency response of FU equalizer can be obtained by inversing the FU frequency response. It is easy to calculate the coefficients of FU equalizer by adaptive filtering, such as LMS, IFFT and so on. From this, we can obtain default value coefficient of FU equalizer. Of course, the test signal can be generated by test signal generator in RRU, then test signal performs the above actions, finally default value coefficient of FU equalizer can be obtained.

Another option is that default value coefficient of FU equalizer comes from the normal operation when the error of Equalizer reaches a certain threshold.

In summary, obtaining a default value coefficient of FU equalizer is a preferred embodiment. The technical effect in doing so is to speed up the process and shorten convergence time.

Figure 4:
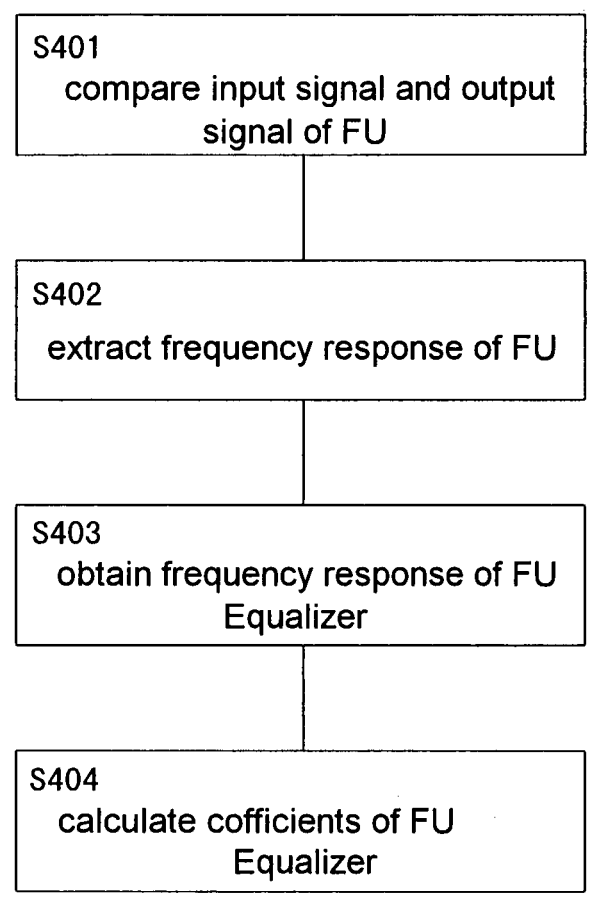
FIG. 4 is a schematic flow diagram of a preferred embodiment of step s203 illustrated in FIG. 2.

In a preferred embodiment of the invention, refer to FIG. 4, said step s203 of calculating coefficients of FU equalizer comprises the steps of:

comparing said input signal of FU with said output signal of FU, s401, extracting frequency response of FU, s402;

obtaining frequency response of FU equalizer by inversing said frequency response of FU, s403;

calculating coefficients of FU equalizer by an adaptive equalizer algorithm, s404.

In a preferred embodiment, said adaptive equalizer algorithm can be implemented by adaptive filtering, such as Least Mean Square, Inverse Fast Fourier Transform and so on.

Figure 5:
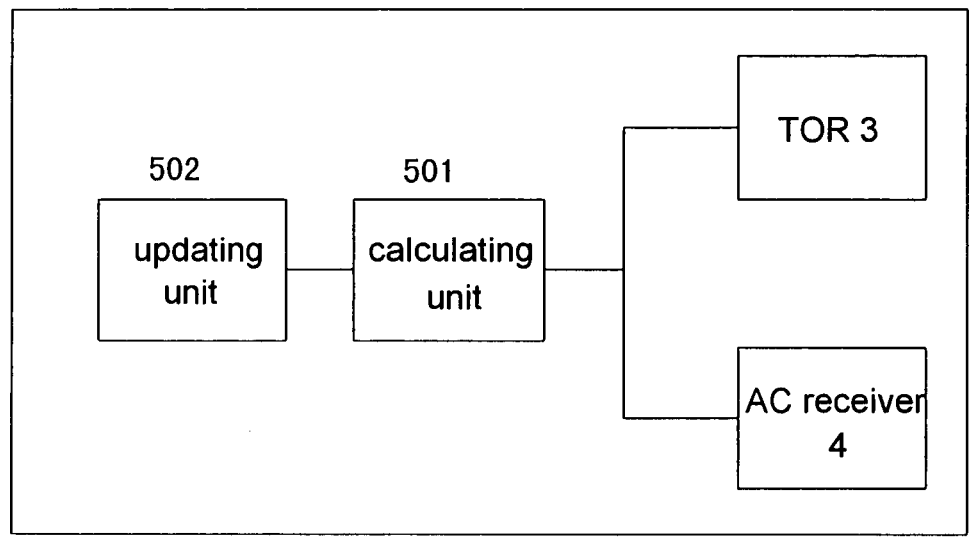
FIG. 5 is a schematic block diagram of an embodiment of a device for compensating frequency response of a filter unit in remote radio unit in real time according to the present invention.

FIG. 5 is a schematic block diagram of an embodiment of a device for compensating frequency response of a filter unit in remote radio unit in real time according to the present invention. Said device is used to implement the above described method according to the invention. Said device comprises TOR 3 for receiving input signal of said filter unit, AC receiver 4 for receiving output signal of said filter unit, calculating unit 501 for calculating coefficients of filter unit equalizer in real time based on said input signal and said output signal, updating unit 502 for 30 updating said filter unit equalizer based on said calculated coefficients in order to compensate frequency response of said filter unit. Said calculating unit 501 and said updating unit 502 can be implemented in real time equalizer 6.

In a preferred embodiment, said device also comprises loading unit 601 for loading a default value coefficient of FU equalizer while initialing RRU. Said default value coefficient of FU equalizer can be stored into memory when RRU is tested by test signal, or said default value coefficient of FU equalizer comes from the normal operation when the error of equalizer reaches a threshold. Loading unit is introduced in order to speed up the process and shorten convergence time.

Figure 6:
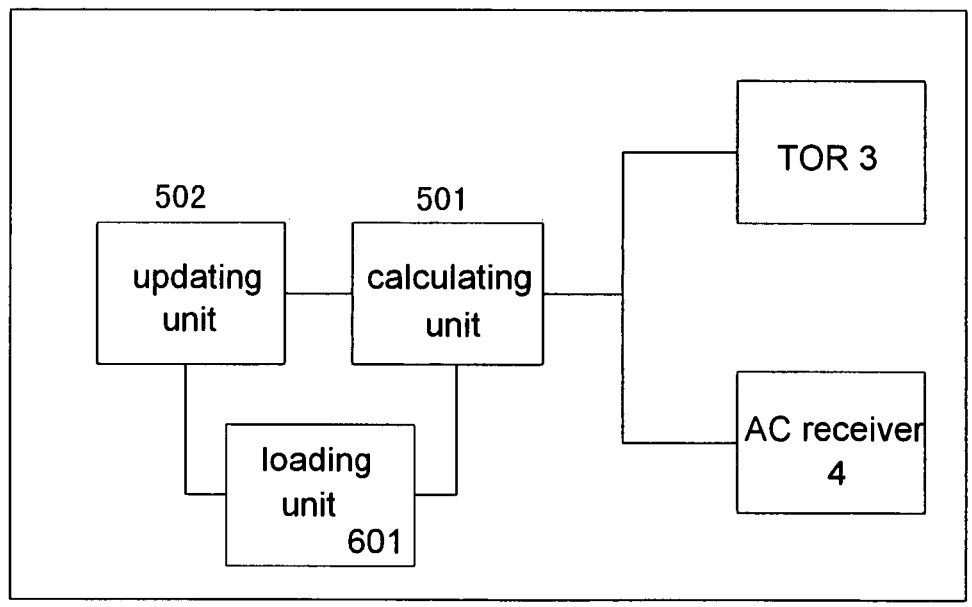
FIG. 6 is a schematic block diagram of a preferred embodiment of a device for compensating frequency response of a filter unit in remote radio unit in real time according to the present invention.

Further, refer to FIG. 6, FIG. 6 is a schematic block diagram of a preferred embodiment of a device for compensating frequency response of a filter unit in remote radio unit in real time according to the present invention. In order to speed up the progress and shorten convergence time, said device also comprises loading unit 601 for loading a default value coefficient of FU equalizer while initialing RRU. In a preferred embodiment, when normal traffic is transmitted, loading unit 601 first loads a default value coefficient of FU equalizer, then calculating unit 501 calculates coefficients of filter unit equalizer, finally updating unit 502 updates said FU equalizer. Said loading unit 601 can also be implemented in real time equalizer 6.

Figure 7:
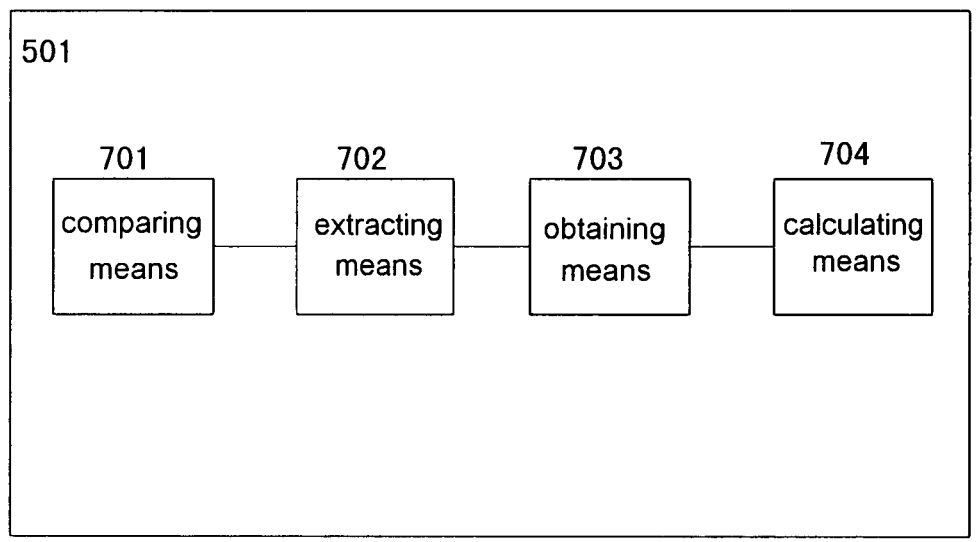
FIG. 7 is a schematic block diagram of an embodiment of calculating unit comprised in said device shown in FIG. 5 according to the present invention.

In another preferred embodiment, refer to FIG. 7, calculating unit 501 comprises:

comparing means 701 for comparing said input signal of FU with said output signal of FU;

extracting means 702 for extracting frequency response of FU;

obtaining means 703 for obtaining frequency response of FU equalizer by inversing said frequency response of FU;

calculating means 704 for calculating coefficients of FU equalizer by an adaptive equalizer algorithm.

In a preferred embodiment, said adaptive equalizer algorithm can be implemented by adaptive filtering, such as Least Mean Square, Inverse Fast Fourier Transform and so on.

Calculating unit 501, configuring unit 502 and loading unit 601 may be implemented in hardware, firmware, software or any combination thereof.

Advantages of the present invention comprise: the FU characteristic is calculated on application environment; since no hardware changes between normal operation and calibration phase, best performance can be obtained real time; the equalization can be done on demand; it can track any change of FU on application environment; the FU replacement cost can be reduced and FU can be replaced without recalibration.

Throughout the description and claims of this specification, the words "comprise", "include" and "contain" and variations of the words, for example "comprising" and "comprises", means "including but not limited to", and is not intended to (and does not) exclude other components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

It will be understood that the foregoing description of the embodiments of the invention has been presented for purposes of illustration and description. This description is not exhaustive and does not limit the claimed invention to the precise forms disclosed. Modifications and variations are possible in light of the above description or may be acquired from practicing the invention. The claims and their equivalents define the scope of the invention.

The invention claimed is:

1. A method for compensating a frequency response of a filter unit in a remote radio unit in real time, the remote radio unit comprising a filter unit equalizer, a transmitter observation receiver, and an antenna calibration receiver, the method comprising:
   receiving an input signal of the filter unit at the transmitter observation receiver;
   filtering the input signal at the filter unit to produce a filtered output signal;
   receiving the filtered output signal at the antenna calibration receiver;
   calculating coefficients of the filter unit equalizer in real time based on the input signal and the filtered output signal; and
   updating the filter unit equalizer based on the calculated coefficients in order to compensate the frequency response of the filter unit.

2. The method of claim 1 further comprising loading a default value coefficient of the filter unit equalizer while initializing the remote radio unit, prior to receiving the input signal of the filter unit at the transmitter observation receiver.

3. The method of claim 2 further comprising:
   testing the remote radio unit by a test signal; and
   storing the default value coefficient of the filter unit equalizer in memory during the testing.

4. The method of claim 2 wherein the default value coefficient of the filter unit equalizer is a coefficient of the filter unit equalizer used when a filter unit equalizer error occurs.

5. The method of claim 1 wherein calculating the coefficients of the filter unit equalizer comprises:
   comparing the input signal with the filtered output signal;
   extracting a frequency response of the filter unit;
   obtaining a frequency response of the filter unit equalizer by inversing the frequency response of filter unit; and
   calculating coefficients of the filter unit equalizer using an adaptive equalizer algorithm.

6. The method of claim 5 wherein the adaptive equalizer algorithm is implemented by adaptive filtering.

7. The method of claim 6 wherein the adaptive filtering is one of Least Mean Square or an Inverse Fast Fourier Transform.

8. The method of claim 1 wherein the filter unit is a wide band passive filter.

9. The method of claim 1 wherein the filter unit equalizer is implemented as a digital filter with programmable coefficients.

10. A device for compensating a frequency response of a filter unit in a remote radio unit in real time, the device comprising:
    a transmitter observation receiver configured to receive an input signal of the filter unit;
    a filter unit configured to filter the input signal to produce a filtered output signal;
    an antenna calibration receiver configured to receive the filtered output signal;
    a calculating unit configured to calculate coefficients of a filter unit equalizer in real time based on the input signal and the filtered output signal; and
    an updating unit configured to update the filter unit equalizer based on the calculated coefficients in order to compensate the frequency response of the filter unit.

11. The device of claim 10 further comprising a loading unit configured to load a default value coefficient of the filter unit equalizer during initialization of the remote radio unit.

12. The device of claim 11 wherein the default value coefficient is stored in memory during testing of the remote radio unit by a test signal.

13. The device of claim 11 wherein the default value coefficient is a coefficient of the filter unit equalizer used when a filter unit equalizer error occurs.

14. The device of claim 10 wherein the calculating unit is configured to:
    compare the input signal with the filtered output signal;
    extract a frequency response of the filter unit;
    obtain a frequency response of the filter unit equalizer by inversing the frequency response of the filter unit; and
    calculate coefficients of the filter unit equalizer using an adaptive equalizer algorithm.

15. The device of claim 14 wherein the adaptive equalizer algorithm is implemented by adaptive filtering.

16. The device of claim 15 wherein the adaptive filtering is one of Least Mean Square or an Inverse Fast Fourier Transform.

17. The device of claim 10 wherein the filter unit is a wide band passive filter.

18. The device of claim 10 wherein the filter unit equalizer is implemented as a digital filter with programmable coefficients.

19. The device of claim 10 wherein the device is included in the remote radio unit.

20. The method of claim 1, wherein the antenna calibration receiver receives the filtered output signal via an air interface.

21. The method of claim 20, wherein the antenna calibration receiver receives the filtered output signal via an antenna of the remote radio unit.

* * * * *

UNITED STATES PATENT AND TRADEMARK OFFICE
CERTIFICATE OF CORRECTION

PATENT NO. : 8,902,962 B2  
APPLICATION NO. : 13/512910  
DATED : December 2, 2014  
INVENTOR(S) : Xu Page 1 of 1

It is certified that error appears in the above-identified patent and that said Letters Patent is hereby corrected as shown below:

IN THE DRAWINGS

Fig. 4, Sheet 4 of 6, in Box "S404", in Line 1, delete "cofficients" and insert -- coefficients --.

IN THE SPECIFICATION

Column 1, Line 61, delete "no" and insert -- not --.

Column 4, Line 39, delete "FUs," and insert -- FUs --.

Column 4, Line 63, delete "time:" and insert -- time. --.

Column 5, Line 59, delete "s401," and insert -- s401; --.

Column 6, Line 10, delete "for 30" and insert -- for --.

Signed and Sealed this  
Seventh Day of April, 2015

Michelle K. Lee  
*Director of the United States Patent and Trademark Office*